US006905967B1

United States Patent
Tian et al.

(10) Patent No.: US 6,905,967 B1
(45) Date of Patent: Jun. 14, 2005

(54) METHOD FOR IMPROVING PLANARITY OF SHALLOW TRENCH ISOLATION USING MULTIPLE SIMULTANEOUS TILING SYSTEMS

(75) Inventors: Ruiqi Tian, Pflugerville, TX (US); Edward Outlaw Travis, Jr., Austin, TX (US); Thomas Michael Brown, Austin, TX (US)

(73) Assignees: AMD, Inc., Sunnyvale, CA (US); Motorola, Inc., Shaumberg, IL (US)

( * ) Notice: Subject to any disclaimer, the term of this patent is extended or adjusted under 35 U.S.C. 154(b) by 84 days.

(21) Appl. No.: 10/401,400
(22) Filed: Mar. 31, 2003
(51) Int. Cl.[7] ............................................ H01L 21/311
(52) U.S. Cl. ...................... 438/697; 438/626; 438/691; 438/692; 438/129; 438/424; 438/631; 438/645; 438/599; 257/752; 257/750; 257/620
(58) Field of Search ................................ 438/626, 691, 438/692, 129, 424, 631, 645, 599, 697; 257/752, 750, 620

(56) References Cited

U.S. PATENT DOCUMENTS

| | | | | |
|---|---|---|---|---|
| 5,278,105 A | * | 1/1994 | Eden et al. ................. | 438/129 |
| 5,854,125 A | * | 12/1998 | Harvey ........................ | 438/626 |
| 5,885,856 A | * | 3/1999 | Gilbert et al. .............. | 438/129 |
| 6,323,113 B1 | * | 11/2001 | Gabriel et al. .............. | 438/584 |
| 6,358,816 B1 | * | 3/2002 | Singh et al. ................. | 438/424 |
| 6,396,158 B1 | * | 5/2002 | Travis et al. ................. | 257/784 |
| 6,593,226 B2 | * | 7/2003 | Travis et al. ................. | 438/626 |
| 6,611,045 B2 | * | 8/2003 | Travis et al. ................. | 257/620 |
| 6,770,929 B2 | * | 8/2004 | Singh et al. ................. | 257/306 |

OTHER PUBLICATIONS

Kahng et al., Filling Algorithms and Analysis for Layout Density Control., IEEE Transaction On Computer Aided Design Of Integrated Circuits and Systems., vol. 18, No. 4, Apr. 1999.*
Stine et al., The Physical and Electrical Effects of Metal–Fill Patterning Practices for Oxide Chemical–Mechanical Polishing Process., IEEE Transaction On Electron Devices,, vol. 45., No. 3, Mar. 1998.*

* cited by examiner

*Primary Examiner*—Matthew Smith
*Assistant Examiner*—Belur Keshavan
(74) *Attorney, Agent, or Firm*—Charles E. Graves

(57) ABSTRACT

In a feature layer of a semiconductor wafer, dummy tiles which overcome the tendency of dishing and erosion to occur during a CMP process are placed with various sizes and in various positions. An isolation zone is provided around active features. A scanning process of the feature layout surveys oxide density and nitride density over the wafer layer outside of said isolation zone. Values of the ratios of oxide/nitride density for two or more length scales which define tiling zones, are calculated. Tile placement and sizing in the zones is dependent upon the oxide/nitride density ratio values; and further upon an oxide deposition model specific to the oxide used in the fabrication process and upon a polishing model of the CMP process being employed.

32 Claims, 9 Drawing Sheets

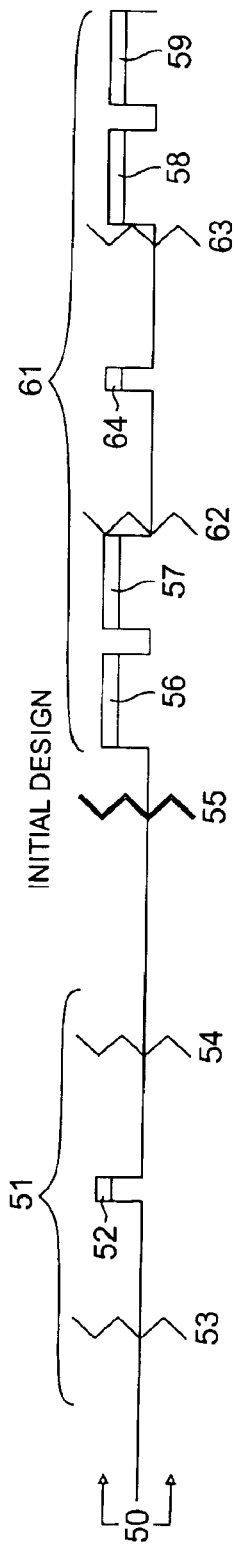
FIG. 12a INITIAL DESIGN
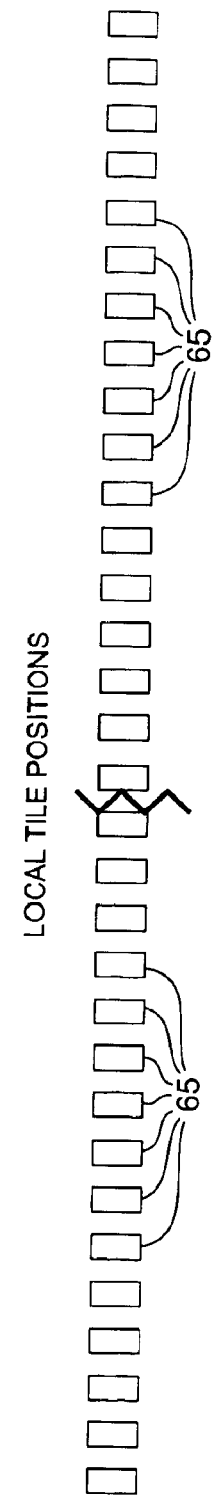
FIG. 12b LOCAL TILE POSITIONS
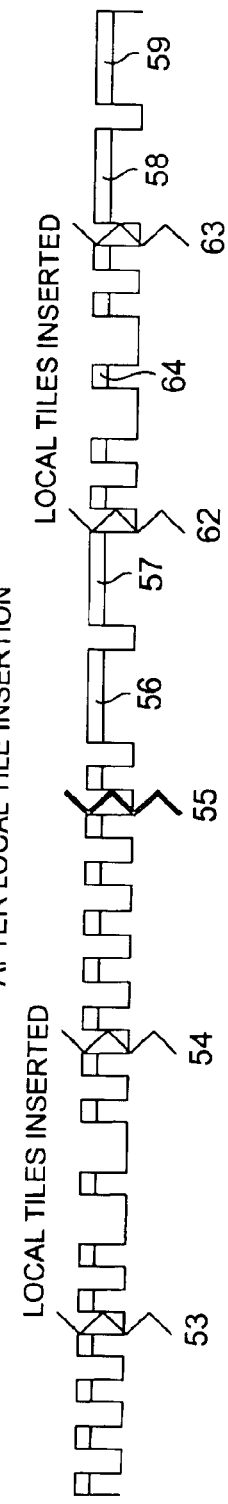
FIG. 12c AFTER LOCAL TILE INSERTION

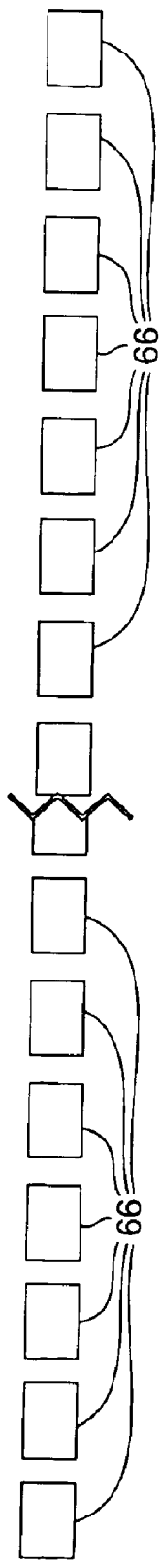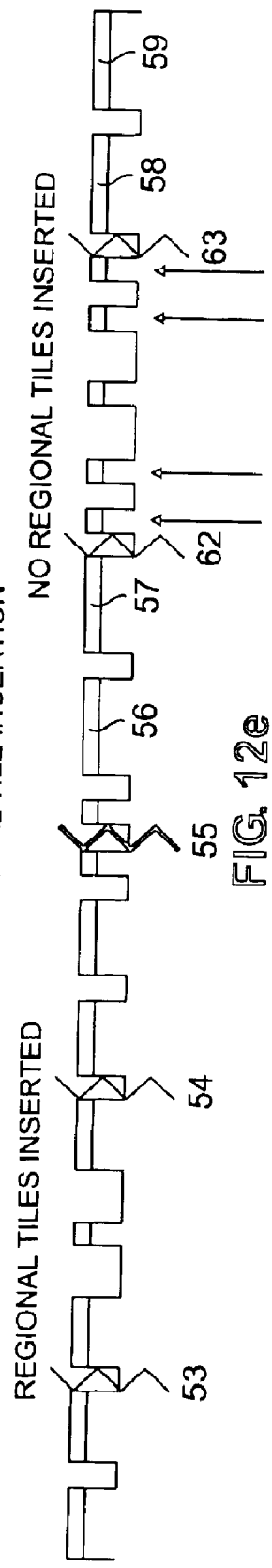

METHOD FOR IMPROVING PLANARITY OF SHALLOW TRENCH ISOLATION USING MULTIPLE SIMULTANEOUS TILING SYSTEMS

TECHNICAL FIELD

This invention relates to semiconductor device manufacturing; and particularly to a methodology for determining the placement of extra or "dummy" features, or "tiles" around active features in a wafer layer in particularly optimized groupings, thus to improve over existing similar methodologies in reducing the adverse effects of overpolishing including dishing and erosion during CMP. The invention also relates to semiconductor wafers manufactured according to the tile placement schemes herein.

BACKGROUND OF THE INVENTION

In integrated circuit device ("IC") manufacture, a succession of material layering processes takes place in which metal, dielectric, and semiconductor materials are successively applied to the surface of the wafer, typically by deposition. A typical sequence is to start with a substrate; then form active devices in one or more semiconductor and dielectric layers; and then form metal interconnects to connect the different layers of the integrated circuit device together. The interconnects are vias and trenches, formed by photolithographically patterning a dielectric surface followed by etching and planarizing. Many stacked layers of the IC are thus electrically interconnected.

As each successive layer is completed, its upper surface must be finished to a high degree of planarity with respect to other already-fabricated metal and dielectric surfaces throughout the wafer. So, for example, in the above process, following a metallization excess metal is removed. The resulting ideally planar surface must be as parallel as possible to the most recently planarized surface.

The process used for planarization in most semiconductor wafer fabrication is chemical mechanical planarization (CMP). CMP involves pressing a semiconductor wafer against a moving polishing surface wetted with a chemically reactive, abrasive slurry in a manner disclosed, for example, in U.S. Pat. No. 5,423,716. A problem with CMP is that at places along a polished surface, the CMP mechanism has a tendency to create uneven, non-planar portions. These take several forms, the most recognized of which is dishing and erosion. The term "planarization" sometimes is used to refer to processes for minimizing dishing and erosion topographies. Both dishing and erosion can lead to more resistive interconnects and cause problems at subsequent CMP and photolithography steps due to the resulting lack of planarity.

Accordingly, for some time now, much work has been directed at reducing the extent of dishing and erosion. At the same time, as integrated circuit fabrication methods have created ever smaller geometries, the planarity requirements for a number of critical process steps have become increasingly stringent. For example, the most critical step for photolithography is typically the polysilicon gate patterning step, which is directly impacted by the topography of the underlying isolation layer. Lack of planarity at this stage is often fatal to the wafer, as the following illustrates.

The most advanced semiconductor processes currently in production typically use a Shallow Trench Isolation (STI) scheme to separate active device regions on the silicon substrate. STI has supplanted the older localized oxidation of silicon (LOCOS) isolation method because it allows for smaller geometries due to the absence of an encroaching "bird's beak" inherent in the LOCOS method. For geometries smaller than 0.35 microns, STI is the preferred isolation method.

The STI process begins with a bare silicon wafer, possibly already patterned with photolithography alignment marks. The wafer is typically oxidized to form a thin "pad oxide" layer which is used as an aid to relieving surface stress. On top of the pad oxide is deposited a silicon nitride film around 1000 to 2000 A thick. Next, photoresist is applied and the trench pattern is exposed and developed in the photoresist. An etch process is used to etch through the nitride and pad oxide and into the underlying silicon, typically to a depth of 3000–6000 A. These trenches' delineate the silicon which will form transistors and other components on the wafer surface, and when filled with oxide will insulate (isolate) these devices from one another.

Following trench etch, the remaining photoresist is stripped off, and oxide is deposited on the wafer to fill the trenches. Various different combinations of thermal, silane, LPCVD, HDP or other types of oxide may be used at this stage. Frequently a small amount of high quality oxide (i.e. thermal or silane) is grown first in the trench to serve as a "liner", followed by a deposition of a larger amount of lower quality oxide (LPCVD, HDP) to completely fill the trenches with some additional amount of oxide overfill.

At this point, a cross-section of a portion of the wafer surface typically is as shown schematically in FIG. 1. The trenches have been filled with oxide, but the oxide has also been deposited on top of the active regions. The oxide over the active regions needs to be removed in order to continue processing, and this task is normally accomplished with CMP. An ideal post-CMP cross-section is depicted in FIG. 2.

The goal of the CMP process is to remove all the oxide over the active regions, while avoiding polishing through the nitride or excessively dishing into the trench oxide. The nitride is stripped off after the CMP process is completed, using a hot phosphoric acid bath; but the nitride cannot be removed if there is any oxide remaining on top of it. Residual nitride of this type will render the chip nonfunctional. On the other end of the spectrum, if the nitride is completely polished away anywhere on the wafer, the active silicon will be exposed to the CMP process and become contaminated, again resulting in a nonfunctional chip. An example of a cross-section of what a poorly planarized chip might look like is shown in FIG. 3. At the left and right edges areas are seen where there is residual oxide over nitride. These areas will result in residual nitride and render the device unusable. Further, the oxide to active step varies, which is also not desirable.

The above illustration describes the bare minimum requirements for a CMP process at STI. However, as topography requirements become more stringent, the best current CMP performance is increasingly inadequate. In an ideal case the step height from the top of the active region to the top of the trench oxide (post-nitride strip) would be the same everywhere in the current die; and on every die in the wafer—regardless of local pattern density, feature size, or die location. In addition, this step height would be targeted such that, by the time the wafer was processed up to poly gate patterning, the top of the trench oxide would be coplanar with the top of the active region. Even for the bare minimum scenario, traditional CMP processes have not been sufficient to achieve consistently good results without further process accommodations.

Specifically, the first generation of STI processes generally addressed the issue of inadequate planarization by using a "reverse active mask etchback" technique. Here, the wafer is masked post-oxide fill using a pattern that is the inverse of the original trench mask. This is either achieved by using the same mask as was used at trench patterning but using a negative-tone resist; or by using the same resist but exposing a second mask which is the photographic negative of the trench mask. The result is that the developed mask covers the trenches while leaving the active regions open, as shown in FIG. 4. Then a wet or dry etch process is used to remove most or all of the oxide over the active regions. The result of using an anisotropic dry etch is shown in FIG. 5 which depicts post-resist strip. After the etch and mask-strip steps, the wafer is polished. This approach causes the wafer incoming to CMP to have much less topography; and therefore CMP has to remove less material and the wafer post-CMP is well planarized. The downside to this method is that it adds several process steps, including a very expensive photolithography step. Since the trench/active layer has some of the smallest geometries on the chip, the photo stepper used to expose this layer will be one of the most advanced and therefore most expensive tools. Since the reverse active masking step uses the exact same geometries as the active masking step, this also requires using the most expensive stepper and therefore is cost prohibitive.

In an effort to eliminate the reverse active mask process, dummy tiles were introduced at the STI level in order to facilitate "direct polishing" of STI. These dummy tiles are small, repeating active features added to large trench areas to increase the effective pattern density in these large trenches. The manner in which they have been added, is established by "rules". Tile size and placement is controlled by the same set physical dimensions in all parts of the die area. The added tiles have no electrical or device function, but exist solely for topographic reasons. By adding tile features, the lowest areas in the die (wide trench areas, such as in the scribe lines) are raised up to be closer in pattern density to the functional areas of the die. This helps to reduce the topography variation within the die pre-CMP by making the amount of oxide distribution more uniform in all areas of the die. Combined with a well-executed CMP process, rule-based tile placement allows one to generate functioning STI-based chips more economically than the reverse active mask procedure. Although the resulting post-CMP topography will usually be worse than when using the reverse active mask, the rule-based placement topography is good enough and the cost savings involved justifies the compromise.

An example of the use of rule-based polishing dummy tiles in a semiconductor device layer is found in U.S. Pat. No. 5,885,856.

Alternatively, instead of simply filling all available open spaces with a repeating rule-based dummy tile pattern, tiles may be designated for placement more deliberately, where they will provide an added benefit to the final post-CMP topography. This approach is known as "model-based placement" A variety of model-based tile placement algorithms have been developed, each seeking to strike an optimum balance among the factors of tile size, tile proximity to circuit features, tile density, and polish uniformity. Model-based tiling methods of placing the tiles, require that the CMP process be characterized thoroughly as to, for example, pad bending, dishing, erosion and polish rate; and then modeled by a set of equations. These equations are then used by a computer algorithm to determine placement for dummy features in the available open spaces so that they will minimize the post-CMP topography. U.S. Pat. No. 6,369,158 exemplifies model-based tile placement in its use of a step in which the specific CMP process influences tile placement.

Either rule-based or model-based tile placement of dummy tiles provides a means to achieve a tighter spatial distribution of active density which generally improves CMP results by reducing non-uniformities. However, in both of these approaches, the size of the tile and the method of placement impact the length scale at which the distribution improvement is achieved.

Rule-based tiling systems have been successful at improving short-scale (i.e., in the range of from 3 um to 30 um) tile non-uniformity, by filling all available open space with small repeating tile patterns. The resulting die, while more uniform at the tile feature scale in this range sometimes have unacceptable die-scale topography variation.

Model-based tiling has been used to address die-scale (i.e., in the range of from 1,000 um to 30,000 um) topography by placing large tiles in the appropriate areas of the die based on the prediction of a topography model. These schemes typically use "single length scale" approaches, as exemplified in U.S. Pat. Nos. 6,093,631 and U.S. Pat. No. 6,323,113. But the resulting model-tiled die, while having good die-scale topography, showed high topography variation at the feature scale of from 3 um to 30 um. Experience has shown that each tiling scheme can affect a particular scale regime. Increasingly, however, the need is to address both long and short scale concerns; and in so doing, to simultaneously address different sources of variation having to do with oxide vs. nitride densities.

SUMMARY OF THE INVENTION

It has been realized that in the step coverage characteristics of the oxide film in the various types of features encountered on a wafer, particularly as to large length scale and small length scale features, the oxide density is not directly related to the nitride density. Rather, the oxide density is strongly affected by the nitride feature size as well as the nitride density. Thus, the oxide and nitride density are only loosely coupled. Moreover, local and regional uniformity variation can also be traced to different sources.

In this invention, for a given material deposition process and a specific size of layout area, the term D, connoting the "oxide density" or "nitride density", is equal to the total oxide (or nitride) volume V deposited on top of layout circuit features inside that area, divided by the product of deposition height H and layout area A:

$$D_{oxide\ or\ nitride} = V_{oxide\ or\ nitride}/(H_{deposition} * A_{layout}) \quad \text{Eq. 1}$$

Based in part in this realization, the invention broadly is a set of optimizing principles for placing tiles, realized by taking carefully into account the nature of any trench fill oxide deposition which allows the nitride pattern density to be decoupled from the oxide pattern density. When very small or narrow active features are coated with, for example, HDP oxide, the amount of oxide over the nitride is proportionally lower compared to the amount of oxide over nitride for a large active feature. Since the desired pattern density distribution can be different during the bulk planarization of oxide compared to the overpolish and nitride clearing portions of the CMP process, the invention realizes the advantageous of using, simultaneously, two (or more) different tiling methods to address the two (or more) different regimes.

Thus the invention in one aspect is a process that at the trench level surveys oxide density and nitride density over an entire wafer surface. Values of the ratios of oxide/nitride density (or nitride/oxide density as the case may be) are developed at various length scales in relation to the feature locations on a die. These values are used to assist in determining the placement and sizing of tiles at both the short scales as well as long length scales, thus to effect a desired local nitride density control as well as to effect a desired oxide density control for oxide-based regional control.

For instance, by using a small narrow tile, the nitride density of the die can be made more uniform at short length scales without significantly affecting the oxide density. Then, larger wider tiles can be placed appropriately within the die to produce the desired oxide density distribution at the die scale. The combination of two different types of tiles, optimized for two different effects at two different length scales, produces topography results superior to those that could be achieved with a single type of tile.

In one embodiment of the invention, one size of tile is specified to produce a high nitride/oxide ratio for local nitride density control issues. Then, a larger tile with lower nitride/oxide ratio is used to add oxide density to die scale areas which are low density. The two different tile sizes are used in the current embodiment to address the two different uniformity issues of nitride-based local control, and oxide-based regional control.

In one example of the use of the invention, in which an HDP trench fill is used, all empty areas are filled with very small fine pitch tiles, thus adding as little oxide added as possible in different areas of the semiconductor layer of interest; but providing a very substantial area of nitride. With the small tiles tentatively placed, the layout is analyzed to find where it may be deficient in oxide. If such areas are found, large tiles are added or "superimposed" on top of the smaller tiles to in effect replace them, thus to greatly increase the oxide density in some areas.

In general, the process first surveys oxide and nitride densities in the areas local—that is—immediately adjacent to circuit features. Next, a local CMP polishing model is combined with the local oxide/nitride density survey results. From these data, an optimum tile shape and density is developed and inserted at the local "low" areas to bolster the structure against the local actions of the CMP process, In a variation, these tiles may be inserted into all available space. At this stage, the tile insertion may be based on existing "rule-based" tile shape and density. The process then turns to surveying topographic uniformity in the larger length scales, using an oxide deposition model germane to the oxide being used, plus a regional polishing model of the CMP process to be used. If the uniformity as predicted by this stage satisfies the known manufacturing requirements, no further tile placement is made. If the needs are not yet met, the process determines available space for "model-based" tiles to be added to, or over the earlier local tiles. The process may need to iterate one or more times to close in on a true optimum tile size and placement strategy.

In another embodiment, the process uses not just two length scales but three or more length scales to size and place tiles to even more closely control uniformity of oxide and nitride on multiple length scales. In this scheme, the type and shape of tile may be specific to each respective length scale. For example, three tiles may be used if it is determined that nitride density control is the most important objective in the 3 um to 30 um distance. The tiles may further be used if both nitride and oxide density control are roughly equally important at 30 um to 300 um, and oxide density control matters most at 300 um to 3000 um.

BRIEF DESCRIPTION OF THE DRAWING

FIGS. 12a through 12e is a further diagram illustrating part of the process for tile insertion as a function of different length scales, starting from an initial circuit feature layout.

DETAILED DESCRIPTION

In the description to follow, general principles of the invention are first discussed, followed by specific explanations of the steps taken to optimize tile placement in multiple length scales which are thereafter applied in the manufacture of semiconductor wafers. The optimization steps rely importantly on applying calculated values of oxide density, nitride density, and the ratio(s) of oxide-to-nitride density. What these parameters mean and how they are measured, is first illustrated.

Figure 1:
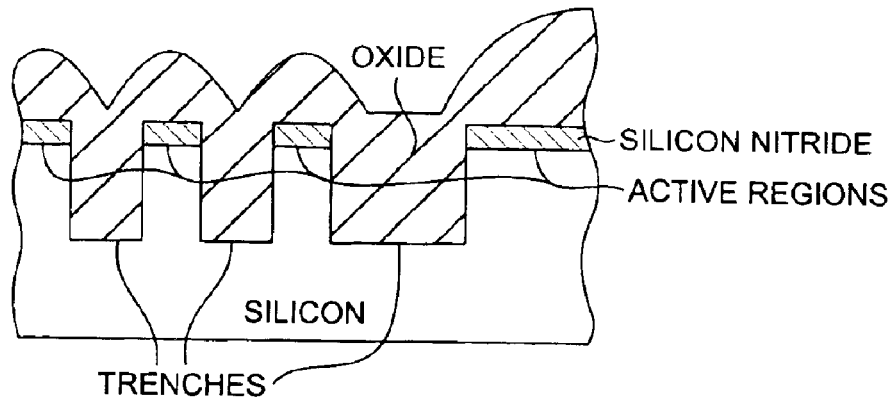
FIGS. 1 through 5 are schematic side perspective views of part of a feature layer of a semiconductor device at various stages of oxide, nitride and photoresist processing.
Figure 2:
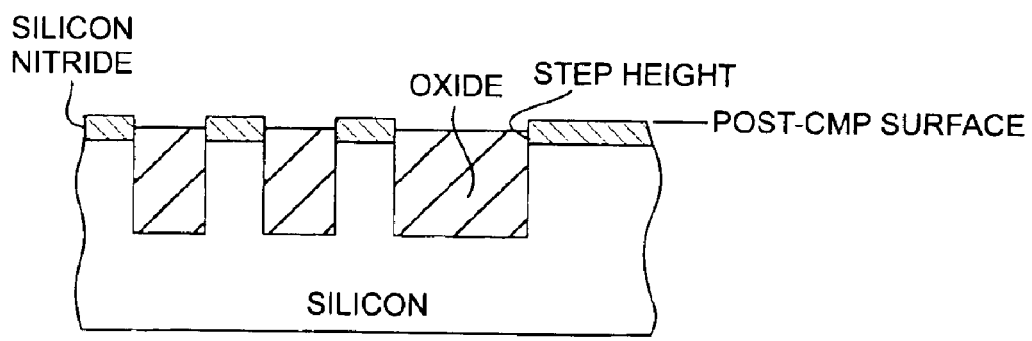
Figure 3:
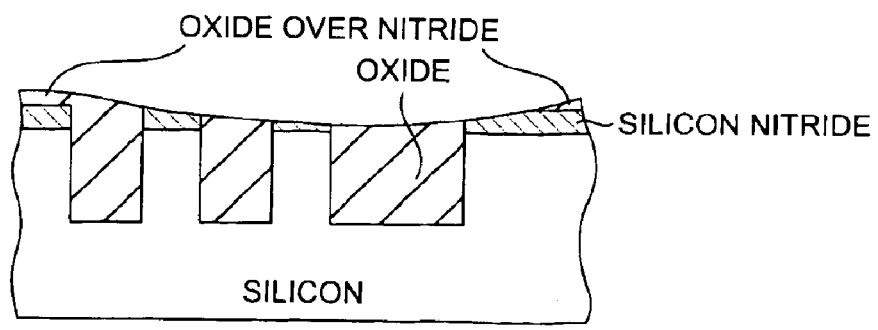
Figure 4:
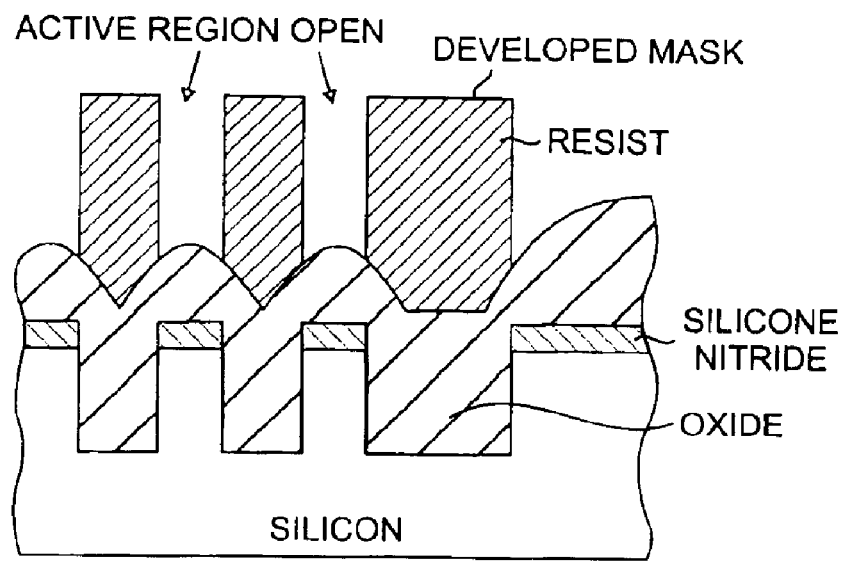
Figure 5:
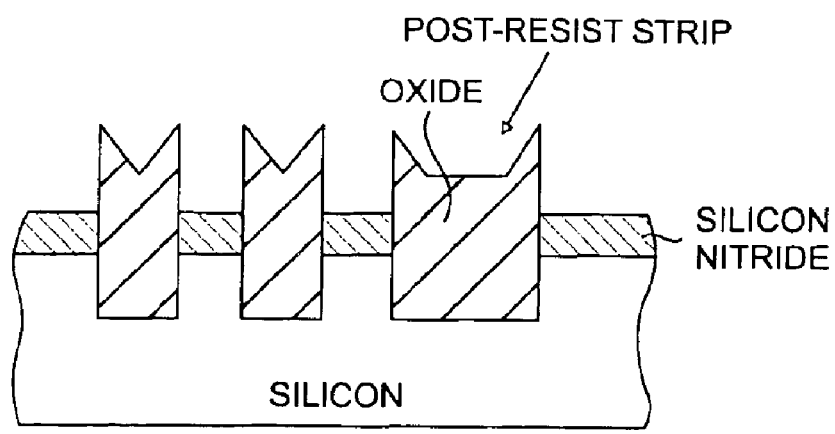
Figure 6:
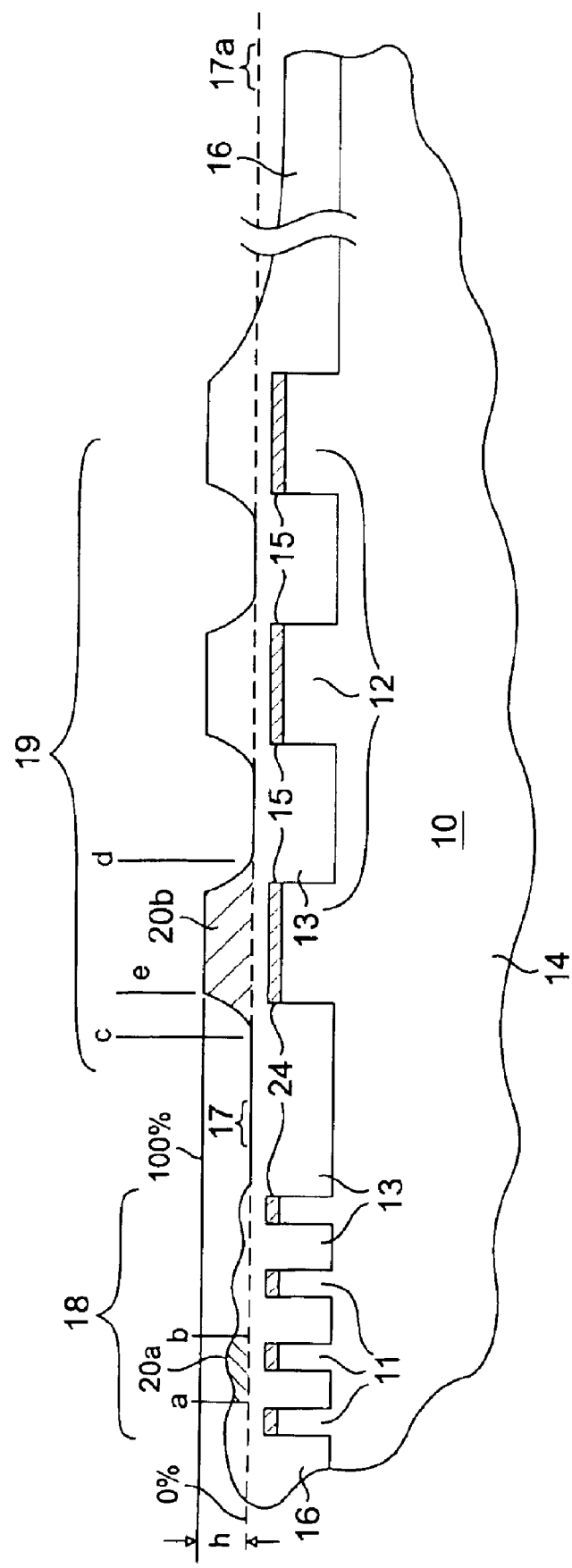
FIG. 6 is a schematic side perspective view of part of a feature layer of a semiconductor device showing the buildup of oxide over nitride at a stage of fabrication.

FIG. 6 represents a "trench" layer portion of a semiconductor 10 fabricated to the point where oxide deposition is completed but before CMP is commenced. Several active device "features" 11, 12 are shown; the features 11 are relatively narrow; and the features 12 are relatively wide. Each of the features 11, 12 is formed of silicon material 14 as a raised area isolated by trenches 13 on either side. The top surfaces of features 11, 12 are coated with silicon nitride 15. A film of oxide 16 is deposited into the length of the trench layer, filling in trenches 13 and accumulating on top of nitride layer 15.

Figure 7:
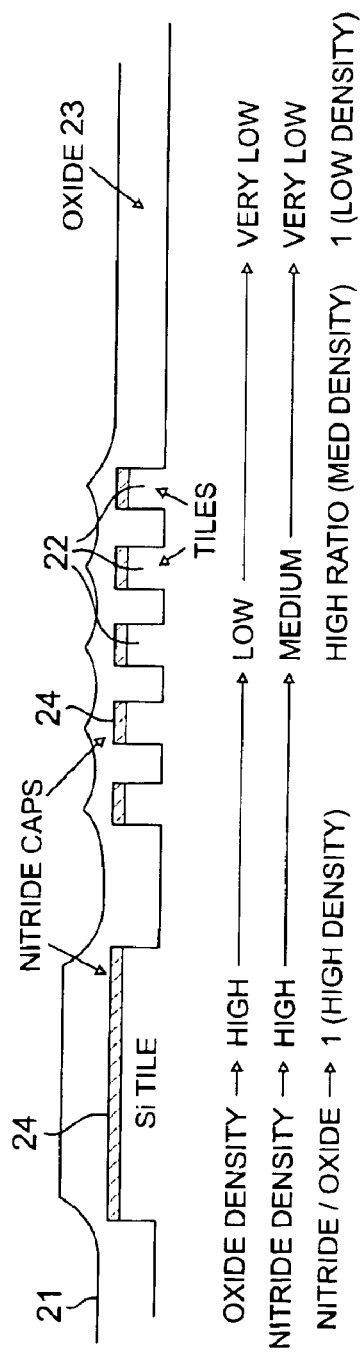
FIGS. 7 and 8 are diagrams exemplifying placement of tiling as a function of oxide density and nitride density.
Figure 8:
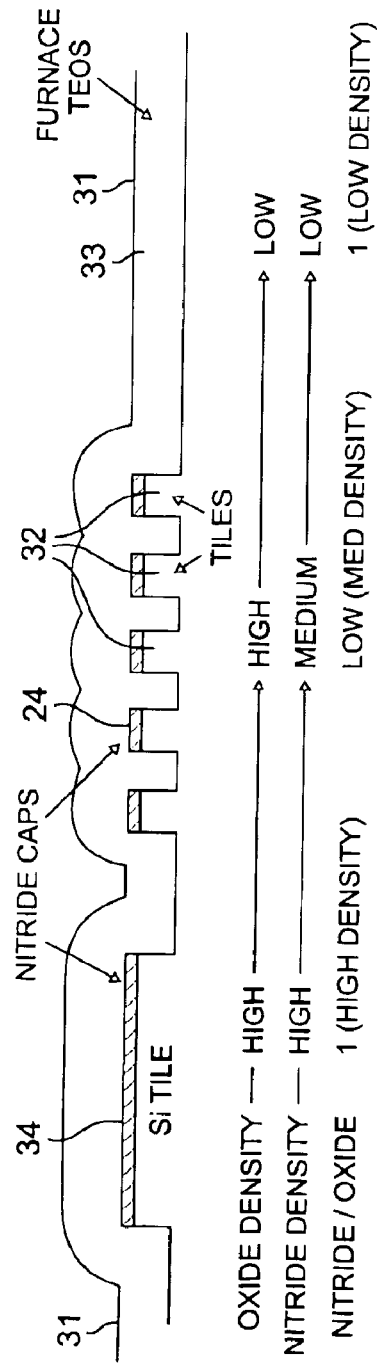

Depending on factors such as feature density, feature size and deposition process, the oxide film 16 tops out at different heights with respect to the top surfaces of nitride layer 15. The variation has one characteristic profile for HDP oxide fill as illustrated in FIG. 7 by the film profile line 21 and a different characteristic profile for a conformal fill such as TEOS, as illustrated in FIG. 8 by the film profile line 31.

If there were no features present at some set of points under the oxide film 16, such as indicated in FIG. 6 in the areas denoted 17, 17a, the oxide film 16 would stabilize generally along the "0%" line of least height above the plane of the top surface of nitride layer 15. If on the other hand the oxide film 16 sits atop features such as II, 12, the film surface follows a height profile dependent on feature size and density. For wide features such as features 12, the oxide height "h" is at its greatest value, defined by the line denoted as 100%. For narrow more densely packed features 11 such as populate the area denoted by bracket 18, the oxide height is some intermediate value between h=0% and h=100%.

It is seen that in the general case shown in FIG. 6, much more oxide is deposited in the areas over the relatively wide features 12 than is deposited over the narrower features 11. A measure of the oxide presence in the horizontal plane within a small feature area denoted with bracket 18, is the vertical cross-section 20a of oxide bounded by the lines a–b. Cross-section 20a is a small sample portion over the narrow and relatively densely-packed features 11. A measure of the oxide presence in a given area of the same horizontal plane within bracket 19, which embraces larger and less densely packed features 12, is the vertical cross-section 20b of oxide bounded by the lines c–d.

Beneath the two sample areas of oxide between lines a–b and lines c–d, nitride is or may also be present. Thus it is possible to know for any given sample area the ratio of oxide to nitride. By integrating the many areas exemplified by sample areas 20a and 20b over different selected length scales, many readings of oxide density, of nitride density and many calculations of the ratios of oxide density to nitride density are made.

One component of active polish uniformity is controlled by the oxide distribution. As seen above, the oxide distribution is a complicated combination of layout feature density and feature size. During CMP, after polishing through the oxide mainly long-range variation of >3000 um remains. Accordingly, placing relatively large tiles in some areas and no tiles in other areas, can reduce this long-range variation.

After the oxide is removed, however, the CMP process enters a two-component polish phase, where nitride and oxide are being simultaneously polished. Now, any area that has no large tiles will recess faster during the second phase of the process, since there is no nitride to slow the polish pad. This leads to non-uniformity on a much shorter scale than the non-uniformity caused by the oxide distribution.

At first glance, the long range oxide distribution needs and the short range nitride distribution needs seem irreconcilable. That is, the nitride uniformity issue appears to require filling ALL empty areas with tile; whereas the oxide uniformity issue appears to require filling only certain empty areas.

However, in accordance with the invention, it has been realized that oxide and nitride densities may to a large degree be treated as de-coupled. Referring to FIG. 8, for groupings 32 of small tiles, when a conformal trench fill material 33 (such as furnace TEOS) is used, the oxide density is much larger than the nitride layout density of nitride caps 34. The opposite is true for HDP fill, however, as seen in FIG. 7. There, the oxide 23 is much less thick over the tiles 22 and nitride caps 34. The wide silicon features on the left-hand side of FIGS. 7 and 8 depict one large tile. Yet in both cases tiles can be specified having lower nitride/oxide density ratio, or higher nitride/oxide ratio. When it is desired to add oxide to slow the polishing pad as it approaches the oxide-nitride interface, tiles with lower nitride/oxide ratios are specified. When it is desired to add nitride to stop the pad polishing after it reaches the oxide-nitride interface, tiles with higher nitride/oxide density ratio are specified.

Figure 9:
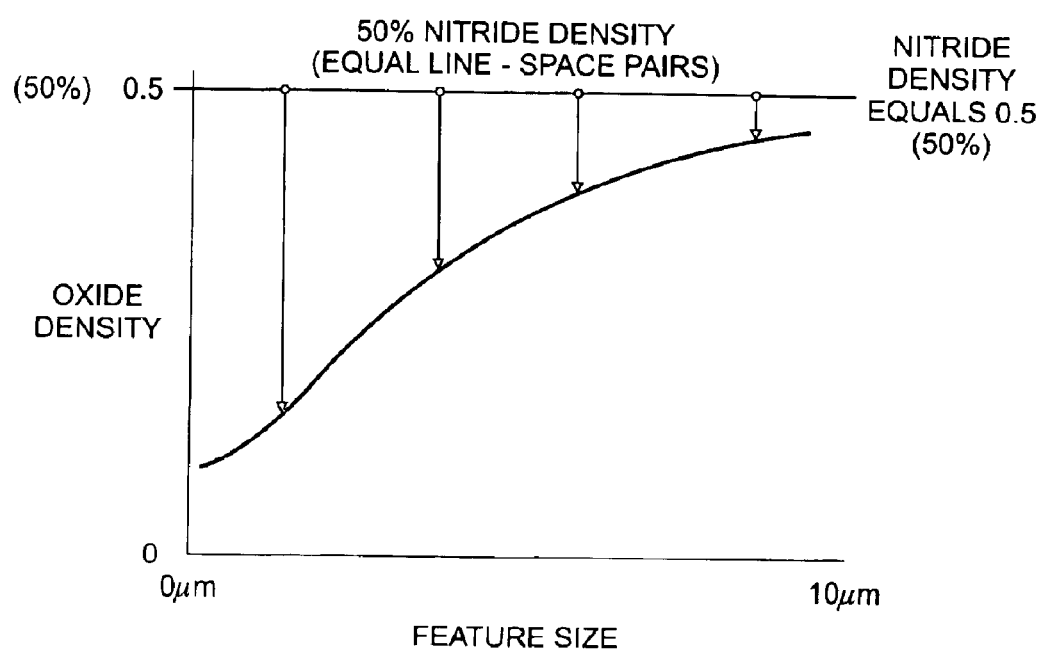
FIG. 9 is a graph illustrating one example of selecting oxide density with a set nitride density, as function of feature size.

Nitride density variation at short length scales (up to approximately 300 um) dominates local uniformity variation; and oxide density at long length scales (1000 um and larger) dominates long range topography uniformity variation. To illustrate, the graph of FIG. 9 plots oxide density at various feature sizes with nitride density held constant at 50%. It is seen that oxide density varies with feature size. The graph illustrates how the "model" for binned sizing converts nitride density to oxide density. Different feature sizes have various values of oxide density even with the same value of nitride density.

In semiconductor wafer structure manufacture using either HDP or conformal trench fill oxide (such as is described in the publication "CMP-MIC" by Liu et al 1999, p. 8; and hereby incorporated by reference) certain design data is generated to define the layout of active circuits. For each layer in a multilayer device, this data includes size, shape and location of active silicon and trench isolation areas. The data constitutes a 2-dimensional layout showing locations of "high" (i.e., active) areas as well as the areas which are designed to contain no active areas, designated "low" areas. Typically it is the "low" areas which need dummy tile additions to offset the factors which generate the topographic non-uniformities. A program capable of generating feature and general topographic representations of a wafer structure at various layers is "IC Station/Virtuoso design system made by Mentor Graphics/Cadence Corp.

The placement of tiles into a given layout of design data is directed generally at improving layout variation at multiple length scales. Therefore the tiling procedure may include multiple passes or iterations through this layout data to realize successive improvements in tile density variation within the areas of interest. It is intended herein primarily to address or to improve only one length scale at a time. However, variation at more than one length scale may be addressed and improved in each pass. The local layout variation is addressed by placing tiles close to the locally low area, for example, to within 0.2 um to 30 um of existing features. The regional layout variation is addressed with tiles placed at a much greater distance from the center of the regionally low area, for example, as much as from 1,000 um to 10,000 um. The effect of regional tiles thus extends much further than the local tiles. Since the local tile placement is more constrained than regional placement, the local placement advantageously is performed first. Tile placement according to the invention, into essentially any feature configuration to improve topographic uniformity, follows the basic teachings as illustrated in examples presented herein.

In applying the invention to a specific wafer manufacture, it is advantageous to take into account the impact of the particular CMP process to be used during manufacture of the wafer. Thus a CMP process characterization is made which includes factors such as pad thickness, pad stiffness and other mechanical aspects of the pad; and to a lesser extent, the slurry abrasiveness.

A contour map of the nitride density is made at a resolution of 20 um to 50 um. Local dummy tiles are placed in any cell where the layout density is low at this length scale. One way to accomplish this is to use a rule-based tile procedure; one, for example will specify placement of tiles where space on the wafer surface is available. The result is to fill areas that are locally low with a tile that is designed to add nitride density, but one which at the same time provides a minimum amount of oxide density.

Since local uniformity variation is controlled predominantly by nitride layout variation, the local tiles should have the highest nitride to oxide density ratio possible. This can be accomplished by exploiting the conformality characteristics of the oxide film which covers the active and nitride features. The feature size of the local tiles will depend on whether the oxide film is conformal as with, for example a furnace TEOS film; or non-conformal as with high density plasma (HDP) TEOS film.

As illustrated earlier in FIG. 8, for an HDP film only a small amount of TEOS is deposited over small active/nitride shapes due to the way in which oxide is removed from feature edges during deposition. The result of this removal process is such that a pattern with a small feature size and thus a large edge to area ratio will have a minimum amount of oxide deposited over the feature. For instance, a narrow line, or small tile (one less than 0.5 um in dimension) can have a nitride layout density approaching 50%, yet have an oxide density of less than 25%. If the active/nitride feature is larger, the edge/area ratio is reduced and the removal process at the feature edges becomes less important. For large features having dimensions in a range of from 3 um to 10 um and larger, the oxide density will approach the nitride density. For HDP oxide films, small tiles with dimensions less than 0.5 um, provide the highest nitride/oxide density, and large tiles of 3 um and larger provide the lowest nitride/oxide density.

For a conformal film like furnace TEOS illustrated in FIG. 8, the step coverage characteristics are very different from HDP TEOS, and so the choice of local tile shape will be different. Small closely-spaced tiles demonstrate a gap-filling type of deposition such that a fine pitch tile design with less than 50% nitride density can produce an oxide density of nearly 100%. For conformal oxide films, large tiles greater than 3 um provide the highest nitride/oxide density; and small tiles give the lowest nitride/oxide density.

An example of a complete tile placement process according to the invention follows. Referring to the flowchart of FIG. 10, the entire wafer reticle layout is dissected, by dividing sections of the die into an array of rectangles of approximately 500 um by 500 um in size. Typically, this is accomplished by surveying with a design rule checker that steps over the die area in 500 um increments. The steps chosen are optimum for the case in which HDP oxide fill is used.

First, local nitride density within each 500 um×500 um rectangle is surveyed in increments of 50 um×50 um, using a local topography model. The objective at this short range is to place active tiles where nitride features are absent—typically, as many tiles as will fit. The local oxide density of each rectangular area is defined as the ratio of raised oxide areas above layout features and total area. The raised oxide area is calculated with binned-sizing operations according to the oxide deposition models for either HDP or conformal fills. The raised oxide area therefore is layout feature-dependent. Optionally, a CMP polish model operating at short distances from features is also applied.

Using a rule-based tile shape and density, tiles are inserted at the local low areas. For the HDP fill process the tile shapes typically are long, narrow rectangles. At this stage the initial tile density can be similar to overall nitride density. The shapes chosen should not aggravate oxide contributions under the oxide deposition model.

Next, topographic uniformity across one (or more) length scales within the overall feature configuration, is assessed. An oxide deposition model is applied as earlier described. Also a regional CMP polish model is applied which advantageously is a weighting function using 2-dimensional Gaussian-like function with parameters calibrated for a specific CMP process condition. Such a model is described more fully in "a Two-Dimensional Low Pass Filter Model for Die-Level Topography Variation resulting from Chemical Mechanical Polishing of ILD Films" by T. K. Yu et al; IEDM 1999, pp. 909–912. A circular convolution of oxide/nitride density distribution and weighting function can be calculated in various ways, for example, using fast Fourier transforms (FFT) and inverse FFT. The selection of calculation method is within the skill of those conversant in the layout-modeling art. However, by choosing FFT and IFFT calculation methods, the process is substantially sped up. Variations of other length scales can be computed similarly with the density distributions surveyed at other sizes and with other weighting functions calibrated for the CMP process.

The next step of the process is to determine whether the topographic uniformity predicted in the calculations thus far satisfy manufacturability requirements. These criteria include, for example, total nitride thickness variation, active to oxide step variation, and maximum within-die topography variation. If variations calculated from the layout of the rule-based tiles already inserted meet manufacturability criteria, the tiling process is completed. On the other hand, if manufacturability criteria are not met, additional model-based tiling is performed as follows.

A calculation is made of available space in the layout. The idea is to determine available area for large, model-based tiles and specify the amount of tiles needed at different locations according to the oxide deposition model and the regional polishing model.

Available space is the space that can be utilized to increase or decrease densities in the layout. It is usually determined using a design rule checker on pre-placed model-based tiles (later, the unused tiles are removed). Available space is defined by physical design rules which set minimum spacing rules, minimum area rules, and exclusion rules that prevent bridging of active features or well boundaries. Available space is also influenced by the incremental amount of area increase or decrease when a rule-based tile is replaced by a model-based tile. Available space is surveyed according to the same dissection of rectangles described at the outset.

With the available space determined, specified rule-based tiles are replaced with model-based tiles. To accomplish this, a tiling algorithm that computes the amount of tiles needed in each rectangular region is employed. The tiling algorithm uses the oxide fill models when considering the effect of a tile. The oxide fill model is the same HDP or conformal fill models described earlier.

The objective of the tiling algorithm is to minimize overall variation in the layout; or to insert the least amount of tiles while overall variation can be kept within manufacturability bounds. If the algorithm is successful in computing the amount of tiles needed at each rectangular 500 um×500 um location, the rule-based tiles are selectively replaced with model-based tiles.

After one pass of model-based tiling, variations of different range scales are determined again to see if the layout is manufacturable. If it is not, then according to the invention, another rule-based tile of different size, shape, or density, or another pass of model-based tiling for the same or different length scale is performed. The tiling approach loops through the sequence of these operations until it finds a manufacturable tiling solution for the layout.

Figure 11:
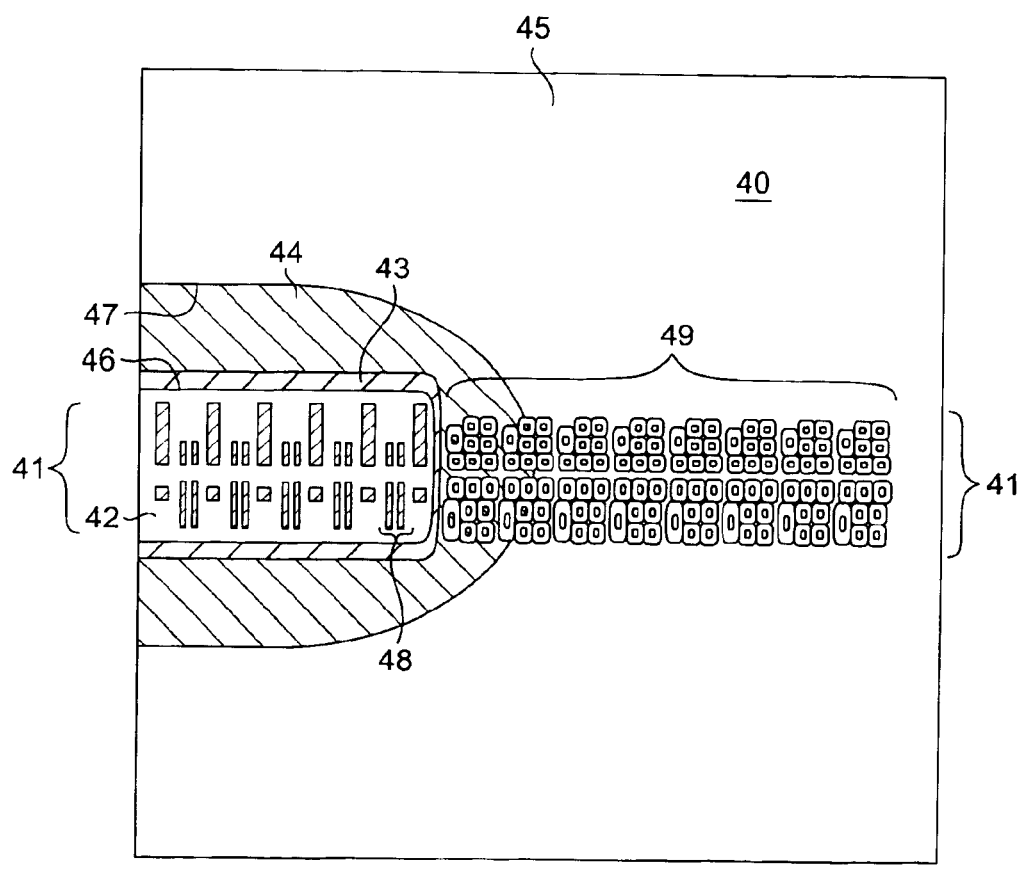
FIG. 11 is a diagram of a top view of features of a semiconductor wafer illustrating one example of how different sizes of tiles are placed as a function of different length scales from the features.

A better appreciation of the range scales under consideration in the present invention is provided by FIG. 11, which represents a top-view segment of a semiconductor feature layer 40, in which the rectangular depicted within the bracketed center region are active circuit details 41. The areas adjacent circuit details 41 and depicted with no cross-hatching, are isolation zone 42. Outboard of isolation zones 42 are zones 43, 44 and 45 which in this example are short, medium and long length scales respectively. Zones 42, 43, 44, 45 contain no circuit details. In a conventional non-tiling environment these zones 42–45 outside of the circuit details 41 are "low" in height relative to the circuit details which are "high".

Isolation zone 42 defines rule-based distances from active features 41 where no tiles may be placed, typically for ranges of 0.5 um to 10 um. It is understood that in each of these zones 43, 44, and 45, tiles may be positioned and sized to dimensions appropriate for the particular zone. (For clarity in FIG. 11, actual tiles are not shown in zones 43, 44, 45.) Short-range zone 43 defines areas typically in a range of from 1 urn to 10 um from the outboard side of isolation zones 42. These areas most immediately adjacent to circuit features 41 lend themselves to rule-based tiling in this invention, although model-based tiling may be added or superimposed thereon.

The medium zone 44 ranges from about 10 um to about 30 um outboard of short-range zone 43. For an HDP process, a tile size typically longer than tiles populating zone 43 is employed in zone 44. The long scale zone 45 ranges from 30 to 100 um from the outboard side of zone 44. Tile size in zone 45 is larger than tile size in short-range zone 43 and possibly also larger than tiles of medium range zone 44. A typical size is 10 um×10 um.

Figure 10:
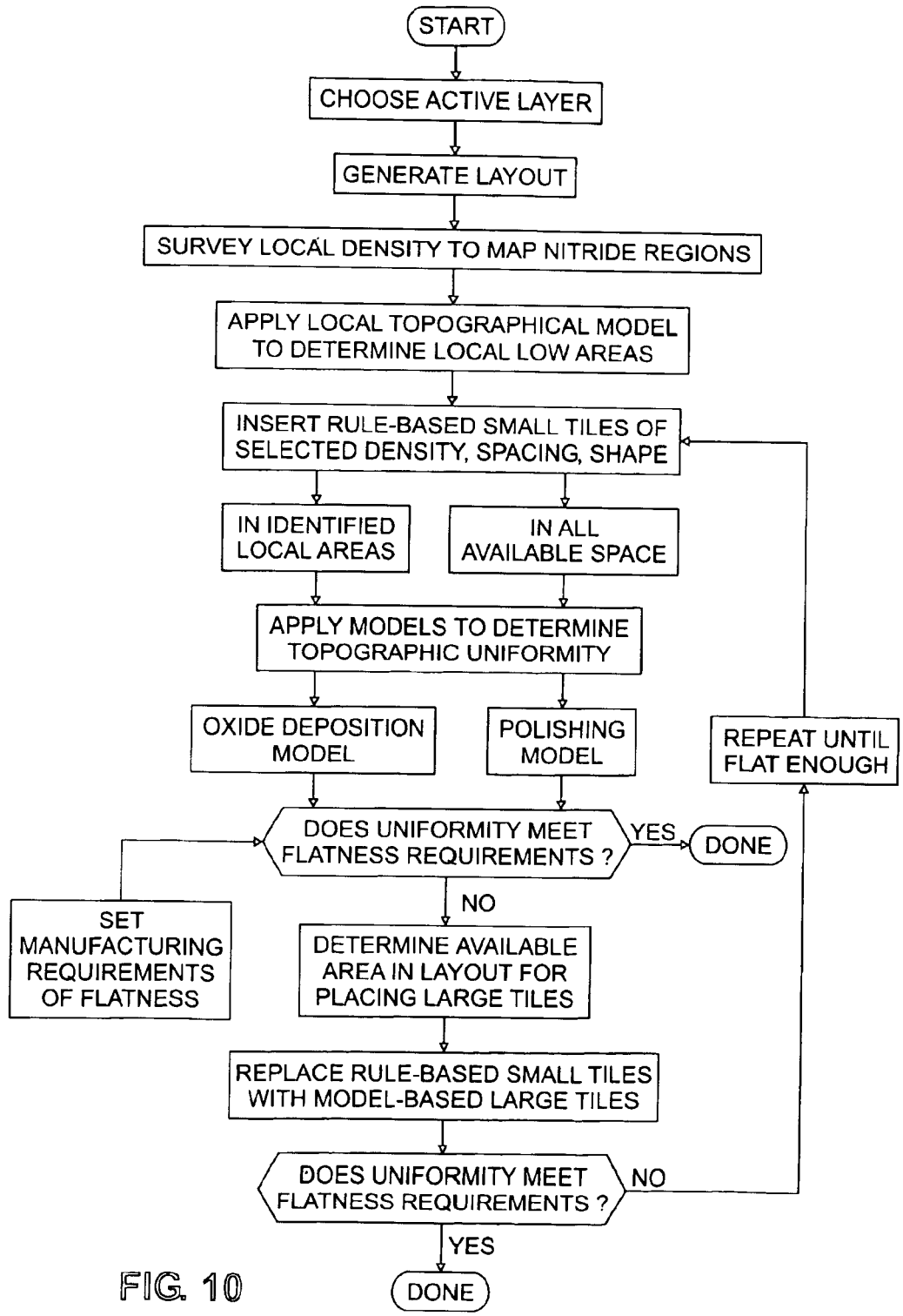
FIG. 10 is a flow chart illustrating one sequence of processing steps to realize tiling placement, material and density according to the invention.

At least the tiles in zones 44, 45 are placed by the results of predictions according to the flow chart of FIG. 10, based on an oxide deposition model, a polishing model and any other regional or global components of the feature layer. Contour maps of needed (predicted) tile density at the three different length scales for zones 43, 44, 45, are created.

In accordance with another aspect of the invention, the boundaries between adjacent zones 43–44 and zones 44–45 may be varied. Thus, to meet model-based predictions of tile density and location needs, a contour line 46 is selected to set the boundary of the interface between short-range zone 43 and medium-range zone 44. Similarly, a contour line 47 is selected to set the boundary of the interface between medium-range zone 44 and long-range zone 45. The contour lines 46, 47 thus define a transition from one length scale to another.

Although the examples presented involve non-overlapping length scales, in circumstances where two sources of non-uniformity at closely-spaced length scales exist, it may be desirable to overlap the length scales. Thus in such a scenario, adjacent length scales of 1–20 um and 10–40 um may be specified.

In an embodiment based on the use of HDP trench fill, tiles in short-range zone 43 are typically 0.3 um×6.6 um; and have a relatively high nitride/oxide ratio centered around 3.32 within a range of from 2.0 to 5.0 Tiles in medium-range zone 44 are typically 2 um×2 um; and have a nitride/oxide ratio centered around 1.43 within a range of from 1.40 to 1.60 Tiles outboard of threshold line 47 are typically 10 um×10 um; and have a nitride/oxide ratio centered around 1.04 within a range of from 1.0 to 1.05. The general idea is to have one set of tiles with nitride/oxide ratio very close to 1; one set with nitride/oxide ratio much larger; and then if needed a third set with an in-between nitride/oxide ratio.

In general, the setting of threshold values is determined by an assessment of just how serious for a given circuit feature array the problem of CMP dishing and erosion in the short, medium and long length scales will be. Thus, for example, after setting contour lines 46 and 47 throughout the feature-free area, it may be decided to change the threshold value of contour line 47, so that tiles in zone 45 are placed only where the CMP dishing/erosion problem is extreme. (In practice, the areas in zone 45 must typically be very "low" to need a tile). To implement such a decision, the contour line 47 is pulled back in directions perpendicular to the tangent at all points along line 47. It is seen that the perpendicular distance between the new and the old contour lines will vary in different places.

The decision process prescribed by the invention's algorithm results in a wide range of possible tiling outcomes. For example, some areas exist where zone 43 tiles may be closest to the circuit features 41. On the other hand, in other areas such as sparsely populated regional low areas, zone 44 tiles may be closest to the circuit features 41. Further, in other areas the zone 45 tiles may be closest to the circuit features 41.

The decision process described in the FIG. 10 flowchart calls for a survey starting at a circuit feature, for example, feature 48 near the tiling zone; and heading outwardly toward the outboard zones 43, 44, 45. By starting at an active circuit feature 48, an isolation zone 42 is first crossed; and then in succession tile zones 43, 44, 45 may be encountered. Sometimes the survey travel is in a straight line, as from specific circuit feature 48; thence through an isolation zone 42 and then through zones 43, 44, 45. Sometimes the travel is straight from isolation zone 42 to medium-range zone 44. Then again, sometimes travel is straight from an isolation zone 42 to long-range zone 45.

The working of the tiling algorithm to adjust thresholds to rearrange or even eliminate tiles for certain areas, based on dictates of the oxide deposition and the polishing models, is illustrated in the following example.

EXAMPLE 1

Referring again to FIG. 11, the tiling algorithm has identified a place 49 in the layout where the long-range (zone 45) tiles have been situated in close (i.e., 1 um) proximity to the nearby circuit features 41. Iterating, the model determines after all that circuit features 41 along the place 49 need some close-in (zone 43) tiling (not shown). Accordingly an array of short-range tiles are provided in the place 49, that is, substituted for the long-range zone 45 tiles.

For this feature array, however, the tiling algorithm then detects that even with short-range tiles thus positioned in place 49, there is still a risk that without more tiling treatment, CMP will cause dishing and erosion. Therefore, some of the short-range (zone 43) tiles positioned at place 49 are replaced with medium-range (zone 44) tiles.

Elsewhere for this feature array, in place 49, the exclusion area 42 is extensive around the local circuit features 41, and running of the algorithm determines that even the medium-range tiles are not helping enough to overcome the predicted dishing and erosion effects of CMP. Accordingly, long-range zone 45 tiles replace certain ones of the medium-range zone 44 tiles.

Although three range scales and two threshold-determining contour lines are described in the above example, the invention may be extended to a larger number of subdivisions of the "vacant" space determined to be available for insertion of tiles. Four or five range scales (and a concomitant number of thresholds) may for example be used for a given feature layout; more range scales may be desirable in cases of more complex STI processes. An upper useful limit of about five (5) different range scales exists, due to the complexities in computing the tile variables of the algorithm—such as convergences and run-time concerns.

FIGS. 12a–12e provide further illustration of the tile placement process according to the invention. An initial design in FIG. 12a of a semiconductor wafer shows a continuum 50 of profiles at a feature level. A regionally sparse (low density) circuit feature area 51 with a single narrow feature 52 in an area segment between brackets 53,

54, it being understood that the design may contain thousands or millions of such features 52 within a sparsely populated area. Far to the right of the divide 55, more dense features begin, with an exemplary regionally dense feature pattern 61 consisting of wide features 56, 57, 58, 59; and an intermediate narrow feature 64 in the region indicated by the bracket 61. The brackets 62, 63 indicate that other features (not shown) are nearby but not necessarily directly beside the feature 64.

FIG. 12*b* shows an array of small tiles identified in accordance with the process of FIG. 10 for insertion as local tiles 65 at positions along the entire continuum 50. FIG. 12*c* shows how the continuum profile changes after local tile insertion into both the sparse feature density area 51 and the dense area 61. Now, in FIG. 12*d*, the process applies the regional oxide and polishing models (and other regional models, if needed) to identify large regional tiles 66 for insertion using one or more selected range scales.

FIG. 12*e* shows the continuum profile after insertion of regional tiles 66. In this example, the regional tiles 66 replaced substantially most or all of the local tiles 65—meaning that as the survey proceeded outward from the given circuit features 52, 56–59 and 64 features using the stated models, the nominal threshold contours were recalculated to replace a short-range threshold with a longer-range threshold. Only the sparsely-populated region 51 received tiles in this outcome. In other outcomes, some local tiles may remain in place in addition to the overlay of regional tiles. In still another case, the algorithm adds only a few regional tiles if the regional density from the outset was only marginally low.

It will be appreciated that the number of possible combinations of insertion of rule-based short-range tiles plus longer range regional model-based tiles, and the replacing of some of the former with the latter, are very numerous depending on the feature size and density and the outcome of the oxide, polishing and any other longer-range model used. The underlying principles of the invention may be applied to all such situations as defined in the claims to follow.

What is claimed is:

1. In the fabrication of a semiconductor wafer feature layer at a stage where circuit features capped with nitride are formed and overlaid with oxide, a process for placing dummy tiles outside the areas containing said circuit features to offset undesired effects during CMP of said feature layer, comprising the steps of:

surveying oxide density and nitride density over the entire top surface of said wafer feature layer;

developing values of the ratios of oxide/nitride density at two or more specific length scales across the entirety of said feature layer;

using said ratio values;

inserting a first set of dummy tiles for local placement with respect to said circuit features in the shortest of said specific length scales; and thereafter inserting a second set of dummy tiles for regional placement with respect to said circuit feature in at least one of the remaining said length scales.

2. The process according to claim 1, comprising the further step of controlling the placement density of said first set of dummy tiles with nitride-based tiles.

3. The process according to claim 1, comprising the further step of controlling the placement density of said second set of dummy tiles with oxide-based tiles.

4. The process according to claim 1, wherein the tiles in said second set of tiles are each substantially larger in area than the tiles in said first set of tiles.

5. The process according to claim 1, wherein the tiles in said second set of tiles are each substantially smaller in area than the tiles in said first set of tiles.

6. The process according to claim 1, wherein said first set of tiles have a selected high nitride/oxide ratio, and said second set of tiles have a substantially lower selected nitride/oxide ratio than said first set of tiles.

7. The process according to claim 1, wherein said first set of tiles have a selected low nitride/oxide ratio, and said second set of tiles have a substantially higher selected nitride/oxide ratio than said first set of tiles.

8. The process according to claim 1 comprising the added step of further determining the placement and sizing of said first set of dummy tiles by:

applying a local CMP polishing model said to said first set of dummy tiles to further adjust local tile shape and size; and inserting the said adjusted local tiles into areas immediately adjacent to said circuit features.

9. The process according to claim 8, comprising the added step of further determining the placement and sizing of said second set of dummy tiles by:

applying an oxide deposition model germane to the oxide being used in said feature layer, applying a regional polishing model of the CMP process being used, adjusting the size and placement of said second set of tiles to meet topographic uniformity predicted by said models, and inserting said second set of tiles as adjusted in size and placement into areas not occupied by said first set of tiles.

10. The process according to claim 9, comprising the further step of adding tiles with lower nitride/oxide ratios where needed to slow the CMP polishing as it approaches an oxide-nitride interface.

11. The process according to claim 9, comprising the further step of adding tiles with higher nitride/oxide density ratios where needed to retard polishing after it reaches said oxide-nitride interface.

12. The process of claim 9, comprising the further step of determining whether said topographic uniformity as predicted by said models is met or not met; and if not met, iterating said process until said predicted topographic uniformity is met.

13. The process of claim 1, wherein the shortest of said two or more specific length scales is substantially 300 um or less; and the longest of said length scales includes one substantially 1000 um or larger.

14. The process of claim 13, wherein said tiles of said first tile set are placed to within 0.2 um or greater of existing features.

15. The process of claim 14 wherein tiles of said second tile set are rectangular with the short side greater than 2 um.

16. In the fabrication of a semiconductor wafer feature layer at a stage where circuit features capped with nitride are formed and overlaid with oxide, a process for placing dummy tiles outside the areas containing said circuit features to offset undesired effects during CMP of said feature layer, comprising the steps of:

creating an isolation zone defined by the area interior of a locus of contour points set at a constant distance from nearest ones of said circuit features;

creating first through $n^{th}$ tiling zones outside of said isolation zone, the exterior boundary of each successive tiling zone comprising a locus of contour points placed a selected constant threshold distance from nearest ones of said circuit features;

surveying oxide density and nitride density over the wafer layer outside of said isolation zone;

based on said survey, developing values of the ratios of oxide/nitride density for each of said first through nth tiling zones;

using rule-based criteria, determining the placement and sizing of a first set of tiles in said first tiling zone; and using said oxide/nitride ratio values, determining the placement and sizing of further sets of tiles in the second through said $n^{th}$ tiling zones.

17. The process of claim 16, wherein the step of determining the placement and sizing of further tiles in the second through said $n^{th}$ tiling zones comprises the further steps of:

applying to the second through said $n^{th}$ tiling zones an oxide deposition model germane to the oxide being used in said feature layer of interest; and applying a regional polishing model of the CMP process being used; and separately adjusting the size and placement of said tiles in each of said second through said $n^{th}$ tiling zones to meet topographic uniformity predicted by said models.

18. The process of claim 17, wherein
the number n of said tiling zones is three,
said three tiling zones consisting of
a short-range zone with tiles substantially 0.3 um×6.6 um having nitride/oxide ratio within a range of from 2.5 to 5.0;
a medium-range zone with tiles substantially 2 um×2 um having nitride/oxide ratio within a range of from 1.4 to 1.6; and
a long-range zone with tiles substantially 10 um×10 um having a nitride/oxide ratio within a range of from 1.0 to 1.05.

19. The process of claim 17, wherein at least one of said first through nth tiling zones outside of said isolation zone overlap with an adjacent one of said tiling zones.

20. The process of claim 16 comprising the further step of determining whether said topographic uniformity as predicted by said models is met or not met; and if not met, changing one or more of said selected constant threshold distances.

21. In the fabrication of a semiconductor wafer feature layer at a stage where circuit features capped with nitride are formed and overlaid with conformal oxide trench fill material, a process for placing dummy tiles outside the areas containing said circuit features to offset undesired effects during CMP of said feature layer, comprising the steps of:

surveying said conformal oxide trench fill material density and nitride density over the entire top surface of said wafer feature layer;

developing values of the ratios of conformal oxide trench fill material/nitride density at two or more specific length scales across the entirety of said feature layer;

using said ratio values;

inserting a first set of dummy tiles for local placement with respect to said circuit features in the shortest of said specific length scales; and thereafter inserting a second set of dummy tiles for regional placement with respect to said circuit feature in at least one of the remaining said length scales, wherein tiles greater than 3 um are used where highest nitride/oxide density is needed, and substantially smaller tiles are used where lowest nitride/oxide density is needed.

22. A semiconductor device comprising a feature layer comprising first groups of active features locally aggregated in close mutual proximity;

second groups of active features separated from said first groups by distances substantially greater than the separation between adjacent features of said first group;

said active features each having had a nitride capping element and a covering oxide deposition;

first arrays of dummy tiles disposed within said oxide deposition closely adjacent to each other and to said first groups of active features; and second arrays of dummy tiles disposed in open areas within said oxide deposition, at separations from said first array determined in part by the measures of the ratio of oxide density to nitride density taken along prescribed survey routes in said open area.

23. A semiconductor device comprising at least one feature layer comprising:

circuit features;

a first set of dummy tiles placed at a selected first length scale in said feature layer outside the areas taken up by said circuit features;

and a second set of dummy tiles placed at a selected second length scale in said feature layer outside the areas taken up by said circuit features and said first set of dummy tiles;

said first and said second length scales being chosen in part based on the ratios of oxide/nitride density as measured across the entirety of said feature layer at a selected point in the fabrication of said feature layer of said semiconductor device.

24. A semiconductor device according to claim 23, wherein said first set of dummy tiles are nitride-based tiles.

25. A semiconductor device according to claim 23, wherein said second set of dummy tiles are oxide-based tiles.

26. A semiconductor device according to claim 23, wherein the tiles in said second set of tiles are each substantially larger in area than the tiles in said first set of tiles.

27. A semiconductor device according to claim 23, wherein the tiles in said second set of tiles are each substantially smaller in area than the tiles in said first set of tiles.

28. A semiconductor device according to claim 23, wherein said first set of tiles have a selected high nitride/oxide ratio, and said second set of tiles have a substantially lower selected nitride/oxide ratio than said first set of tiles.

29. A semiconductor device according to claim 23, wherein said first set of tiles have a selected low nitride/oxide ratio, and said second set of tiles have a substantially higher selected nitride/oxide ratio than said first set of tiles.

30. A semiconductor device according to claim 23, wherein the shorter of said length scales is substantially 300 um or less; and the longer of said length scales is substantially 1000 um or larger.

31. A semiconductor device according to claim 30, wherein said tiles of said first tile set are placed to within 0.2 um or greater of said circuit features.

32. A semiconductor device according to claim 31, wherein tiles of said second tile set are rectangular with the short side greater than 2 um.

* * * * *